United States Patent
Xu et al.

(10) Patent No.: US 11,308,997 B1
(45) Date of Patent: Apr. 19, 2022

(54) METHOD AND SYSTEM FOR DIRECT ACCESS TO FLASH MODULES

(71) Applicant: Yangtze Memory Technologies Co., Ltd., Wuhan (CN)

(72) Inventors: Xiaodong Xu, Wuhan (CN); Yi Chen, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 17/228,205

(22) Filed: Apr. 12, 2021

Related U.S. Application Data

(63) Continuation of application No. PCT/CN2021/075013, filed on Feb. 3, 2021.

(51) Int. Cl.
*G11C 7/10* (2006.01)
*G11C 7/22* (2006.01)

(52) U.S. Cl.
CPC ............ *G11C 7/1045* (2013.01); *G11C 7/109* (2013.01); *G11C 7/1063* (2013.01); *G11C 7/222* (2013.01)

(58) Field of Classification Search
CPC ................................. G11C 7/1045; G11C 7/10
USPC ....................................................... 365/233.1
See application file for complete search history.

(56) References Cited

U.S. PATENT DOCUMENTS

| | | | | |
|---|---|---|---|---|
| 7,804,720 B2 * | 9/2010 | Lee | ............ | G11C 8/10 365/189.03 |
| 8,194,493 B2 * | 6/2012 | Ware | ............ | G11C 11/4063 365/230.03 |
| 8,737,143 B2 * | 5/2014 | Kondo | ............ | G11C 7/1045 365/189.12 |
| 2014/0082260 A1 | 3/2014 | Oh et al. | | |
| 2019/0206478 A1 | 7/2019 | Jun | | |

FOREIGN PATENT DOCUMENTS

| | | |
|---|---|---|
| CN | 110892483 A | 3/2020 |
| DE | 102020115958 A1 | 12/2020 |

OTHER PUBLICATIONS

The World Intellectual Property Organization (WIPO) International Search Report for PCT/CN2021/075013 dated Nov. 1, 2021 4 pages.

* cited by examiner

*Primary Examiner* — Muna A Techane
(74) *Attorney, Agent, or Firm* — Anova Law Group, PLLC

(57) ABSTRACT

A memory device includes a substrate, a controller disposed on the substrate and providing an external interface, and a plurality of flash memory dies connected to the controller through an internal interface. The external interface includes at least a bypass pin, a mode selection pin, and a data pin, and is used by an external host to direct access the plurality of flash memory dies through the controller. The bypass pin is used to enable the controller to enter in a direct access state in which the mode selection pin and the data pin are operational; and the mode selection pin is used to trigger the controller to receive a mode code on the data pin and to receive a mode code value on the data pin. The mode code indicates one of a plurality of predetermined input-output modes of the controller in the direct access state, and the mode code value determining information under the predetermined input-output mode indicated by the mode code.

20 Claims, 11 Drawing Sheets

| Pin Name | Description |
|---|---|
| Bypass | Pull high before power up to force controller enter into direct access NAND mode. |
| MS | Mode Switch Enable |
| CLK | Clock for latch Mode decode, data in, data out from DQ0 |
| RB# | Ready Busy pin |
| DQ0 | The serials input/output for RLPC |
| DQ1~7 | Optional, in case X8 IO to improve data throughput rate |

FIG. 3

| Mode | Mode Code | Description |
|---|---|---|
| Die Selection | 001 | Select /deselect one, partial or all dies |
| SDR/DDR Switch | 010 | Switch host IO between SDR and DDR |
| Pattern Select | 011 | Simplified data generator: Random, Fix, Inverse, Decrease, Increase, etc. |
| Command In | 100 | NAND command in cycle |
| Address Input | 101 | NAND address input cycle |
| Data In | 110 | NAND data in cycle |
| Data Out | 111 | NAND data out cycle |

FIG. 7

| Mode | Mode | | | Bytes | Description |
|---|---|---|---|---|---|
| Die Selection | 0 | 0 | 1 | b0 b1 ... b7 b0 ... | 2 or 4 bytes length, each bit mapping to one die, 1 – select, 0 – deselect, able to set multi-dies |
| SDR/DDR Switch | 0 | 1 | 0 | | 1 byte length, SDR – 0x0, DDR – 0x1 |
| Pattern Select | 0 | 1 | 1 | | 1 byte length, Random – 0x0, Fix – 0x1, Inverse – 0x2, Decrease – 0x4, Increase – 0x8 |
| Command In | 1 | 0 | 0 | | Follow NAND ONFI/Toggle command |
| Address Input | 1 | 0 | 1 | | |
| Data In | 1 | 1 | 0 | | |
| Data Out | 1 | 1 | 1 | | |

FIG. 8

| Byte 0 | | | | | | | | | | | | | | | | Byte 1 | | | | | | | | | | | | | | | | Description |
|---|---|---|---|---|---|---|---|---|---|---|---|---|---|---|---|---|---|---|---|---|---|---|---|---|---|---|---|---|---|---|---|---|
| CH0 | | | | CH1 | | | | CH2 | | | | CH3 | | | | CH0 | | | | CH1 | | | | CH2 | | | | CH3 | | | | |
| CE0 | CE1 | CE2 | CE3 | CE0 | CE1 | CE2 | CE3 | CE0 | CE1 | CE2 | CE3 | CE0 | CE1 | CE2 | CE3 | CE0 | CE1 | CE2 | CE3 | CE0 | CE1 | CE2 | CE3 | CE0 | CE1 | CE2 | CE3 | CE0 | CE1 | CE2 | CE3 | |
| 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | Select all 16 dies |
| 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | Deselect all 16 dies |
| 1 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | Select 1 die of 4 channels |
| 1 | 1 | 0 | 0 | 1 | 0 | 0 | 0 | 0 | 0 | 0 | 0 | 0 | 0 | 0 | 0 | 1 | 1 | 0 | 0 | 1 | 0 | 0 | 0 | 0 | 0 | 0 | 0 | 0 | 0 | 0 | 0 | Select 2 dies of 4 channels |
| : | : | : | : | : | : | : | : | : | : | : | : | : | : | : | : | : | : | : | : | : | : | : | : | : | : | : | : | : | : | : | : | |
| 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | Select 4 dies of 1 channel |
| : | : | : | : | : | : | : | : | : | : | : | : | : | : | : | : | : | : | : | : | : | : | : | : | : | : | : | : | : | : | : | : | |
| 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | Select 1 die of 1 channel |

FIG. 9

| Byte 0 | | | | | | | | Pattern Type | Example |
|---|---|---|---|---|---|---|---|---|---|
| b0 | b1 | b2 | b3 | b4 | b5 | b6 | b7 | | |
| 0 | 0 | 0 | 0 | 0 | 0 | 0 | 0 | Random | Input by Data In mode |
| 1 | 0 | 0 | 0 | 0 | 0 | 0 | 0 | Fix | If the start byte is 0x55, then all 0x55 |
| 0 | 1 | 0 | 0 | 0 | 0 | 0 | 0 | Inverse | If the start byte is 0xAA, then 0x55, 0xAA, 0x55, .... |
| 0 | 0 | 1 | 0 | 0 | 0 | 0 | 0 | Decrease | If the start byte is 0xFF, then 0xFE, ..., 0x00, 0xFF, ..., 0x00 |
| 0 | 0 | 0 | 1 | 0 | 0 | 0 | 0 | Increase | If the start byte is 0x00, then 0x01, ..., 0xFF, 0x00, ..., 0xFF |

FIG. 10

METHOD AND SYSTEM FOR DIRECT ACCESS TO FLASH MODULES

RELATED APPLICATION

This application is a continuation application of PCT Patent Application No. PCT/CN2021/075013, filed on Feb. 3, 2021, content of which is incorporated by reference in its entirety.

FIELD OF THE TECHNOLOGY

This application relates to the field of semiconductor technology and, specifically, to a method and system for direct access to flash memory modules.

BACKGROUND OF THE DISCLOSURE

Smartphones and other mobile devices more and more rely on flash memory as the main storage means, which drives eMMC (embedded multi-media controller) volumes, pushing faster speeds and transitioning into UFS (universal flash storage) and other higher speed interfaces. To keep up with market demands, NAND Flash technology is rapidly evolving. However, the advances in NAND Flash technology have raised quality and reliability challenges for NAND manufacturers, renewing the need for increased test coverage without hiking up the cost of test. Currently, to test NAND devices at the package level, two approaches are often used to access NAND flash in eMMC/UFS packages, a bypass mode, and an isolate mode.

In the bypass mode, the flash chip controller is embedded (or design-in) with one set of NAND interface, several scan pins, and one bypass pin, and a test pad is used to connect to substrate to access the NAND interface pins, scan pins, and the bypass pin. To direct access the inside NAND modules, after the flash chip is powered, the bypass pin is forced to HIGH, which make the controller enter in the bypass mode. Under this mode, the inside NAND modules were connected to the NAND interface, and the scan pins are used to select a specific NAND module for access/testing. However, the bypass mode requires the full NAND interface pins to be provided on the controller and the same pins on the test pad, and the throughput is often not high.

In the isolate mode, the flash chip controller is embedded with an isolate pin. To direct access the inside NAND modules, after the flash chip is powered, the isolate pin is forced to HIGH, which place the controller is an "isolated" state, i.e., the connection between the controller and the NAND modules is set to HIZ (high impedance) from the controller output. That is, the controller is no longer connected to the NAND modules, and the test pad is connected to the pins of each NAND channel to direct access the NAND modules for testing. However, the isolation mode requires a large number of pins on the test pad to connect the NAND modules and, under some circumstances, the pins of the NAND channel may be inaccessible for testing.

The disclosed devices and methods are directed to solve one or more problems set forth above and other problems.

SUMMARY

In one aspect of the present disclosure, a memory device is provided. The memory device includes a substrate, a controller disposed on the substrate and providing an external interface, and a plurality of flash memory dies connected to the controller through an internal interface. The external interface includes at least a bypass pin, a mode selection pin, and a data pin, and is used by an external host to direct access the plurality of flash memory dies through the controller. The bypass pin is used to enable the controller to enter in a direct access state in which the mode selection pin and the data pin are operational; and the mode selection pin is used to trigger the controller to receive a mode code on the data pin and to receive a mode code value on the data pin. The mode code indicates one of a plurality of predetermined input-output modes of the controller in the direct access state, and the mode code value determining information under the predetermined input-output mode indicated by the mode code.

According to an embodiment of the present disclosure, the external interface further includes a clock pin and a ready pin for bus operations while the controller is in the direct access state.

According to an embodiment of the present disclosure, the substrate includes a plurality of test pads respectively connected to the bypass pin, the mode selection pin, the data pin, the clock pin, and the ready pin; and the external host uses the plurality of test pads to connect to the bypass pin, the mode selection pin, the data pin, the clock pin, and the ready pin.

According to an embodiment of the present disclosure, the external interface further includes seven additional data pins, and the seven additional data pins in combination with the data pin are used for a byte-wider data transmission on the external interface via a corresponding byte-wider parallel data bus.

According to an embodiment of the present disclosure, the predetermined input-output modes include a die-selection mode; and the mode code of the die-selection mode indicates that one or more of the plurality of flash memory dies are selected for direct access, and the mode code value following the mode code of the die-selection mode determine the one or more of the plurality of flash memory dies.

According to an embodiment of the present disclosure, the predetermined input-output modes further include a data-rate switch mode; and the mode code of the data-rate switch mode indicates whether a data rate switch is to be performed, and the mode code value following the mode code of the data-rate switch mode determines a single data rate (SDR) or a double data rate (DDR) to be switched to.

According to an embodiment of the present disclosure, the predetermined input-output modes further include a pattern-selection mode; and the mode code of the pattern-selection mode indicates whether a data pattern is to be generated by the controller to improve throughput, and the mode code value following the mode code of the pattern-selection mode determine the data pattern to be generated by the controller.

According to an embodiment of the present disclosure, the predetermined input-output modes further include a command-in mode, an address-in mode, a data-in mode, and a to data-out mode; the mode code of the command-in mode indicates a command-in cycle following the mode code of the command-in mode on the data pin; the mode code of the address-in mode indicates an address-in cycle following the mode code of the address-in mode on the data pin; the mode code of the data-in mode indicates a data-in cycle following the mode code of the data-in mode on the data pin; and the mode code of the data-out mode indicates a data-out cycle following the mode code of the data-out mode on the data pin.

According to an embodiment of the present disclosure, the mode code is a 3-bit code or a 4-bit code.

According to an embodiment of the present disclosure, the plurality of flash memory dies are NAND memory dies, the plurality of flash memory dies and the controller are packaged in one eMMC or UFS package.

According to an embodiment of the present disclosure, each of the flash memory dies includes a test register to be set by the controller to cause the flash memory die to use a reduce low pin count (RLPC) standard to communicate over the internal interface, such that data on the data pin is relayed to and/or from the flash memory die based on the RLPC standard.

According to an embodiment of the present disclosure, the controller includes: an input/output logic to receive the data on the data pin; an RLPC translation logic to convert the data on the data pin to signals on the internal interface based on the RLPC standard; and a control logic to set the predetermined input-output mode based on the mode code.

In another aspect of the present disclosure, a method is provided for testing a memory device. The memory includes a substrate, a controller disposed on the substrate and providing an external interface, and a plurality of flash memory dies connected to the controller through an internal interface. The method includes operating a bypass pin in the external interface to enable the controller to enter in a direct access state in which a mode selection pin and a data pin in the external interface are operational; providing a plurality of predetermined input-output modes of the controller in the direct access state; and triggering, by the mode selection pin in the external interface, the controller to receive a mode code on the data pin in the external interface, and to receive a mode code value on the data pin. The mode code indicates one of the plurality of predetermined input-output modes, and the mode code value determines information under the predetermined input-output mode indicated by the mode code. The method further includes directly accessing, by use of the data pin, the plurality of flash memory dies through the controller.

According to an embodiment of the present disclosure, the external interface further includes a clock pin and a ready pin, and the method further includes performing bus operations, by use of the clock pin and the ready pin, while the controller is in the direct access state; the substrate includes a plurality of test pads respectively connected to the bypass pin, the mode selection pin, the data pin, the clock pin, and the ready pin, and the method further includes using the plurality of test pads to connect to the bypass pin, the mode selection pin, the data pin, the clock pin, and the ready pin.

According to an embodiment of the present disclosure, the method further includes: performing a byte-wider data transmission, by use of seven additional data pins in combination with the data pin, in the external interface, on the external interface via a corresponding byte-wider parallel data bus.

According to an embodiment of the present disclosure, the predetermined input-output modes include a die-selection mode, and the method further includes: placing the mode code of the die-selection mode on the data pin after triggering the controller to receive a mode code, to indicate that one or more of the plurality of flash memory dies are selected for direct access, and sending the mode code value following the mode code of the die-selection mode to select the one or more of the plurality of flash memory dies.

According to an embodiment of the present disclosure, the predetermined input-output modes further include a data-rate switch mode, and the method further includes: placing the mode code of the data-rate switch mode on the data pin after triggering the controller to receive a mode code, to indicate whether a data rate switch is to be performed, and sending the mode code value following the mode code of the data-rate switch mode to determine a single data rate (SDR) or a double data rate (DDR) to be switched to.

According to an embodiment of the present disclosure, the predetermined input-output modes further include a pattern-selection mode, and the method further includes: placing the mode code of the pattern-selection mode on the data pin after triggering the controller to receive a mode code, to indicate whether a data pattern is to be generated by the controller to improve throughput, and sending the mode code value following the mode code of the pattern-selection mode to determine the data pattern to be generated by the controller.

According to an embodiment of the present disclosure, the predetermined input-output modes further include a command-in mode, an address-in mode, a data-in mode, and a data-out mode; and the method further includes: placing the mode code of the command-in mode indicating a command-in cycle following the mode code of the command-in mode on the data pin; placing the mode code of the address-in mode indicating an address-in cycle following the mode code of the address-in mode on the data pin; placing the mode code of the data-in mode indicating a data-in cycle following the mode code of the data-in mode on the data pin; and placing the mode code of the data-out mode indicating a data-out cycle following the mode code of the data-out mode on the data pin.

According to an embodiment of the present disclosure, the mode code is a 3-bit code or a 4-bit code.

According to an embodiment of the present disclosure, the method further includes: setting a test register included in each of the flash memory dies via the controller to cause the flash memory die to use a reduce low pin count (RLPC) standard to communicate over the internal interface, such that data on the data pin is relayed to and from the flash memory die based on the RLPC standard.

In another aspect of the present disclosure, a controller is provided for controlling a plurality of flash memory dies. The controller includes an external interface; and an internal interface, through which the plurality of flash memory dies are connected to the controller. The external interface includes at least a bypass pin, a mode selection pin, and a data pin and is used by an external host to direct access the plurality of flash memory dies through the controller. The bypass pin is used to enable the controller to enter in a direct access state in which the mode selection pin and the data pin are operational. The mode selection pin is used to trigger the controller to receive a mode code on the data pin, the mode code indicating one of a plurality of predetermined input-output modes of the controller in the direct access state, and to receive a mode code value on the data pin, the mode code value determining information under the predetermined input-output mode indicated by the mode code.

According to an embodiment of the present disclosure, the external interface further includes seven additional data pins, and the seven additional data pins in combination with the data pin are used for a byte-wider data transmission on the external interface via a corresponding byte-wider parallel data bus.

According to an embodiment of the present disclosure, the predetermined input-output modes include a die-selection mode; and the mode code of the die-selection mode indicates that one or more of the plurality of flash memory dies are selected for direct access, and the mode code value following the mode code of the die-selection mode determine the one or more of the plurality of flash memory dies.

According to an embodiment of the present disclosure, the controller further includes: an input/output logic to receive the data on the data pin; an RLPC translation logic to convert the data on the data pin to signals on the internal interface based on the RLPC standard; and a control logic to set the predetermined input-output mode based on the mode code.

Other aspects of the present disclosure can be understood by those skilled in the art in light of the description, the claims, and the drawings of the present disclosure.

BRIEF DESCRIPTION OF THE DRAWINGS

FIG. 3 is a table illustrating certain interface pin definitions consistent with the disclosed embodiments of the present disclosure;

FIG. 7 is a table illustrating certain mode selection definitions consistent with the disclosed embodiments of the present disclosure;

FIG. 8 is a table illustrating certain mode selection and corresponding data consistent with the disclosed embodiments of the present disclosure;

FIG. 9 is a table illustrating certain die selection data descriptions consistent with the disclosed embodiments of the present disclosure;

FIG. 10 is a table illustrating certain pattern selection mode code and data descriptions consistent with the disclosed embodiments of the present disclosure.

DETAILED DESCRIPTION

The following describes the technical solutions in the embodiments of the present disclosure with reference to the accompanying drawings. Wherever possible, the same reference numbers will be used throughout the drawings to refer to the same or like parts. Apparently, the described embodiments are merely some but not all of the embodiments of the present disclosure. Features in various embodiments may be exchanged and/or combined. Other embodiments obtained by a person skilled in the art based on the embodiments of the present disclosure without creative efforts shall fall within the scope of the present disclosure.

Figure 1:
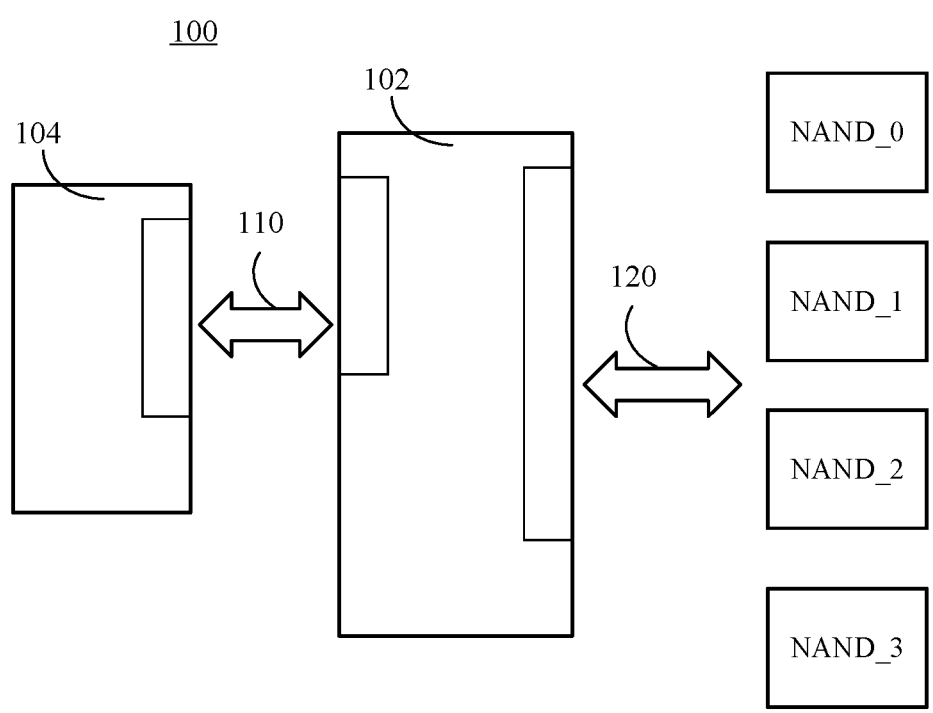
FIG. 1 illustrates an operating environment incorporating certain embodiments of the present disclosure.

FIG. 1 illustrates an operating environment incorporating certain embodiments of the present disclosure. As shown in FIG. 1, operating environment 100 (e.g., a flash memory testing system) includes a controller 102, a host device 104, a plurality of NAND dies or modules (e.g., NAND_0, NAND_1, NAND_2, and NAND_3), an interface 110 between the host device 104 and the controller 102, and an interface 120 between the controller 102 and the NAND modules. The components shown in FIG. 1 are exemplary only, other devices may also be included. Although a total four NAND modules are shown in FIG. 1, any number of NAND modules may be used.

Each NAND module may be a separate NAND die, and the plurality of NAND modules may be separated NAND dies packaged together to form a flash memory chip. The controller 102 may also be packaged together with the plurality of NAND dies to support input/output/control interfaces of the flash memory chip. For example, both the controller 102 and the plurality of NAND modules/dies reside in a common package, and the controller 102 provides external devices with interfaces to access the NAND modules/dies. In such case, the NAND modules/dies may be inaccessible directly to the external devices without the controller 102, such as the host device 104.

Alternatively, the controller 102 and the plurality of NAND dies may reside in separate packages. For example, the controller 130 may reside in a controller package, while the NAND dies may reside in one or more flash packages. In certain embodiments, the NAND dies may be mounted on a printed circuit board with no packaging at all, or the NAND dies may be stacked together without packaging. Other configurations may also be used.

The controller 102 may access (e.g., read, write, control, etc.) the NAND modules through the interface 120. The interface 120 may include a NAND interface. That is, the interface 120 may support a NAND interface protocol, which includes any appropriate interface protocol and control signals supporting reading, writing, and erasing functionalities of the NAND modules. Other memory interfaces may also be used.

Further, the host device 104 may be a separate device configured to directly access the NAND modules over the interface 110, such as during a flash memory test. For example, the host device 104 may be a CPU or other type of controller connected to the controller 102 via the interface 110. The host device 104 may also be any circuitry located on a same circuit board as the controller 102, or a separate circuit board from the controller 102.

In certain embodiments, the host device 104 may be a flash memory tester (testing device) for testing the NAND modules or testing the flash chip containing the controller 102 and the NAND modules. The flash chip may be a completely packaged chip mounted on a circuit board, in which real-time or run-time testing may be performed by the tester. In certain embodiments, the flash chip may be pre-packaging, that is, the flash chip may be still in the manufacturing process, and the substrate containing the controller 102 and the NAND dies/modules may be used for testing. In such case, the substrate may include test pads connected to the controller 102 and/or the NAND modules for testing the NAND modules. Other types of devices may also be used as the host device 104.

The host device 104 may be connected with the controller 102 via the interface 110. When the host device 104 and the controller 102 are on a same circuit board or package, the interface 110 may include a circuit bus including certain signal lines connecting the host device 104 and the controller 102. When the host device 104 and the controller 102 are on separate circuit boards or packages, the interface 110 may include a connection or a coupling mechanism to connect the host device 104 and the controller 102, such as a standard wiring connection (e.g., USB) or a remote connection including a wireless connection).

In one embodiment, the host device 104 may be a tester for testing the flash chip containing the controller 102. The interface 110 may include certain signals (or signal lines) connected to test pads on the substrate of the flash chip, and the tester may attach or clamp test pins or probes to the test pads for direct access the NAND modules through the controller 102.

Figure 2:
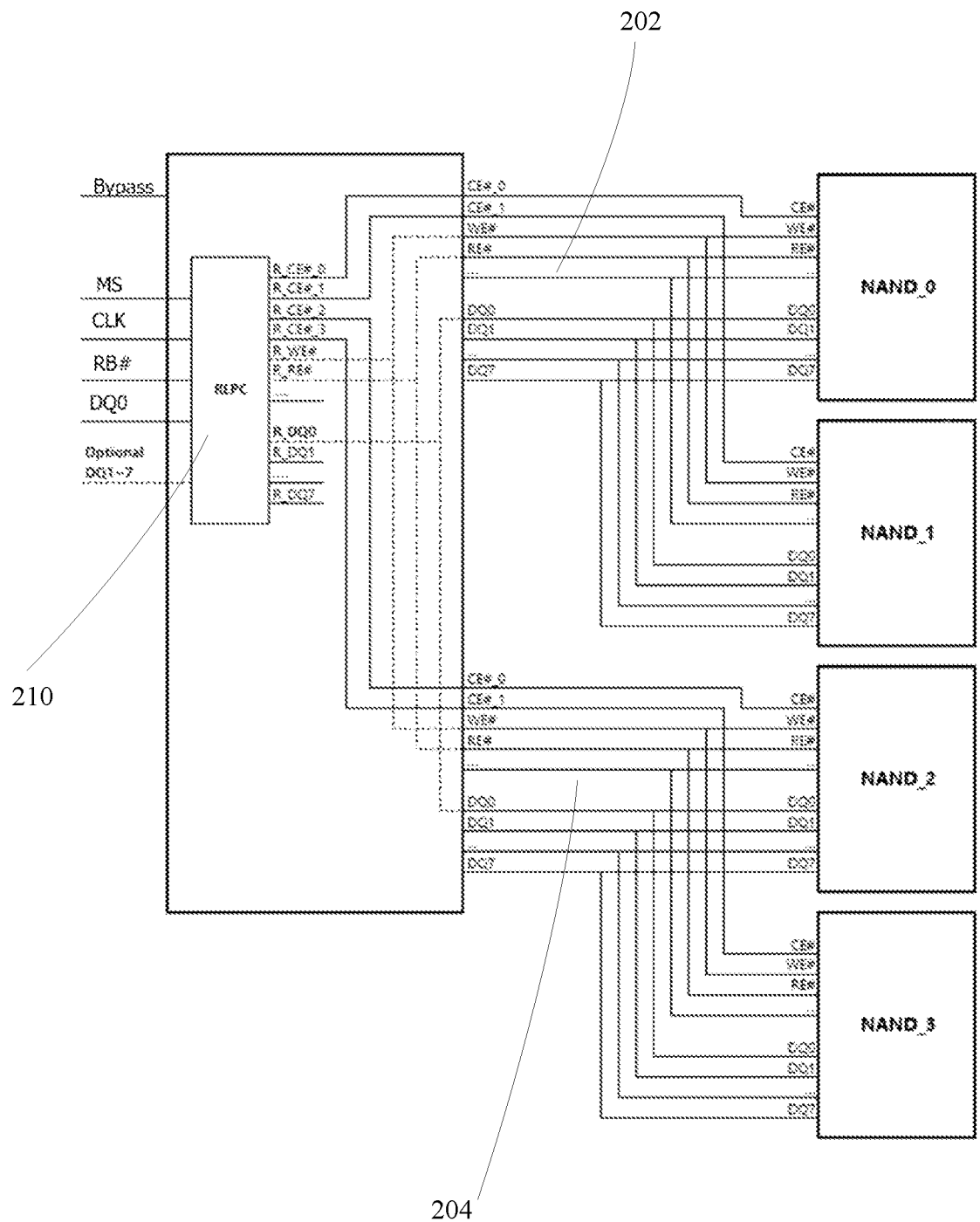
FIG. 2 illustrates an exemplary configuration of a controller, NAND modules, and certain interface signals consistent with the disclosed embodiments of the present disclosure.

FIG. 2 illustrates an exemplary configuration of the controller 102, NAND modules, and certain interface signals consistent with the disclosed embodiments of the present disclosure. As shown in FIG. 2, the controller 102 is connected to the NAND modules (NAND_0, NAND_1, NAND_2, and NAND_3) through the interface 120, which includes two-channels, and each channel supports a NAND interface. Specifically, the controller 102 is connected to NAND_0 and NAND_1 through a first channel 202 and is connected to NAND_2 and NAND_3 through a second channel 204. Any number of channels and/or NAND modules may be used.

The first channel 202 includes two chip enable signals (CE #_0, CE #_1) which correspond to respective CE # of NAND_0 and NAND_1. The first channel 202 also includes other NAND interface signals, e.g., WE #, RE #, DQ0-DQ7, which correspond to respective WE #, RE #, DQ0-DQ7 on each of NAND_0 and NAND_1. The second channel 204 also includes two chip enable signals (CE #_0, CE #_1) which correspond to respective CE # of NAND_2 and NAND_3. The first channel 202 also includes other NAND interface signals, e.g., WE #, RE #, DQ0-DQ7, which correspond to respective WE #, RE #, DQ0-DQ7 on each of NAND_2 and NAND_3.

The controller 102 may also provide certain signals (signal lines or pins) included in the interface 110, including a Bypass signal, an MS (mode select) signal, a CLK (clock) signal, a RB # signal, and a DQ0 (data line). Other signals may also be included. Optionally or additionally, to increase bus throughput, data lines DQ1-DQ7 are also provided, such that a byte-wide parallel data bus (DQ0-DQ7) can be used to perform data transmission/receiving. FIG. 3 is a table illustrating certain interface pin definitions consistent with the disclosed embodiments of the present disclosure.

As shown in FIG. 3, the Bypass pin may be pulled high before power up to force controller 102 to enter in direct access NAND mode, i.e., the bypass mode. The term direct access, as used herein, means that an external access to a NAND module/die of a memory device directly, i.e., via an interface protocol used to interact with the NAND module/die instead of with the memory device as a whole. The interface protocol may be implemented on a physical connection directly to the NAND module/die and/or using a protocol conversion among more than one physical connections to the NAND module/die. When the controller 102 enters in the bypass mode, the controller 102 and/or the flash chip may be referred as in a direct access state. The MS pin may also be treated as a mode switch enable, i.e., the edge triggering the mode selection operation. The CLK pin is provided to enable decode, data in and data out of the interface 110 and the internal logic. The RB # pin is provided to control bus operation by indicating a ready or busy state. DQ0 is for serial input/output under RLPC standard. The DQ1-7 are optional, and may be used to improve data throughput by using 8 bit bus instead of a bit serial input/output.

Further, returning to FIG. 2, the controller 102 may include a direct access control logic 210 to interact with the external interface (e.g., interface 110) on one side (i.e., an external side) and the internal interface (e.g., interface 120) on the other side (i.e., an internal side). In certain embodiments, the direct access control logic 210 connects to the MS signal, CLK signal, RB # signal, DQ0, and, optionally, DQ1-DQ7. On the internal side, the direct access control logic 210 provides R_CE #0-R_CE #3, R_WE #, R_RE #, R_DQ0, R_DQ1-R_DQ7, etc., connected with corresponding signal lines of the two-channel interface to the NAND modules. For example, signals R_CE #0-R_CE #3 correspond to individual CE # of each of NAND modules (NAND_0, NAND_1, NAND_2, and NAND_3). Further, signals R_WE #, R_RE #, R_DQ0, and R_DQ1-R_DQ7 corresponding to WE #, RE #, DQ1, and DQ1-DQ7 of the two-channel interface. Other arrangements may also be used.

Figure 4:
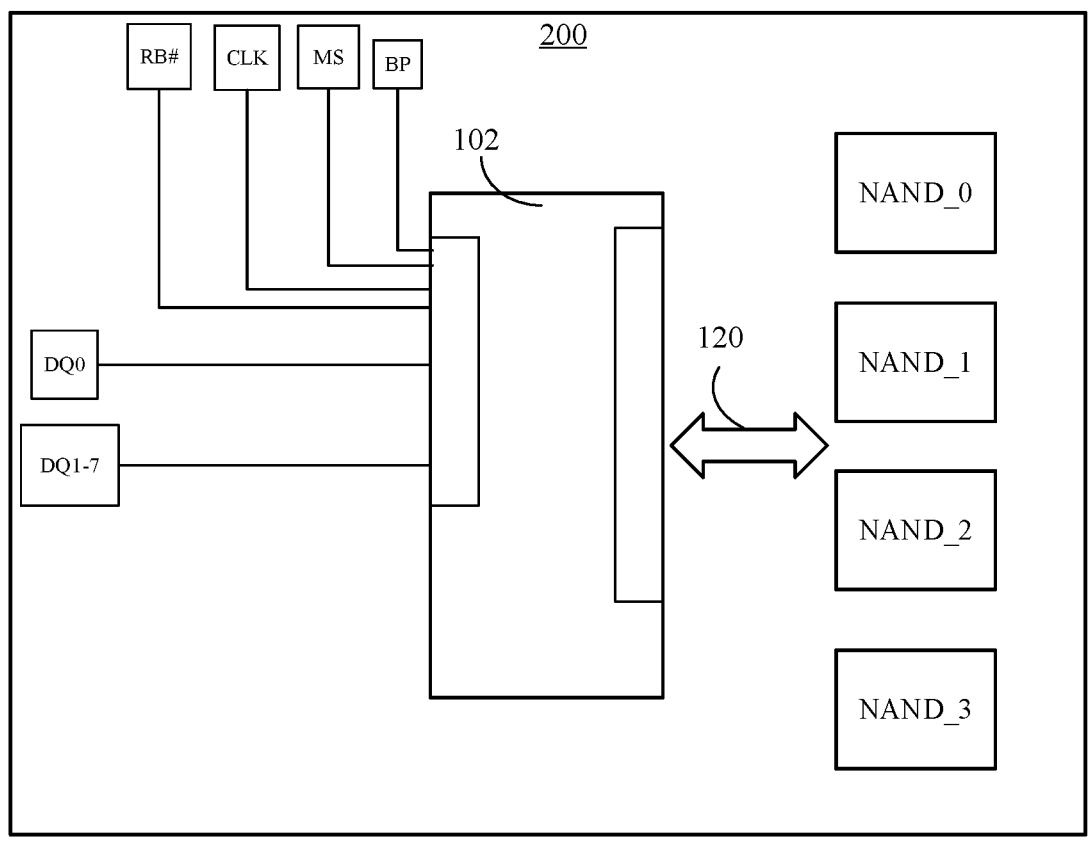
FIG. 4 illustrates an exemplary flash chip consistent with the disclosed embodiments of the present disclosure.

That is, via a small number of signal pins (Bypass, MS, CLK, RB #, DQ0, etc.), the controller 102 can provide an interface to bypass the controller and to have direct access to the NAND modules/dies. When the flash chip, containing the controller 102 and the NAND modules, and the host 104 are separate devices on circuit boards, these signal pins may be part of a bus interface between the controller 102 and the host 104 for run-time testing. In certain embodiments, the flash chip containing the controller 102 and the NAND modules is in the manufacturing process. FIG. 4 illustrates an exemplary flash chip consistent with the disclosed embodiments of the present disclosure.

As shown in FIG. 4, the flash chip includes a substrate 200 having the controller 102, the plurality of NAND dies (NAND_0, NAND_1, NAND_2, and NAND_3), and the interface 120 between the controller 102 and the NAND dies. The controller 102 includes the signal pins Bypass, MS, CLK, RB #, and DQ0, and optionally DQ1-DQ7 for 8-bit bus operation. Further, a plurality of test pads are located close to the edge of the substrate 200 and connected to corresponding signal pins. For example, the BP test pad is connected to the Bypass pin on the controller 102, the MS test pad is connected to the MS pin on the controller 102, the CLK test pad is connected to the CLK pin on the controller 102, the RB # test pad is connected to the RB # pin on the controller 102, and the DQ0 test pad is connected to the DQ0 pin on the controller 102. Optionally, if DQ1-DQ7 are provided on the controller 102, corresponding test pads for DQ1-DQ7 are also provided on the substrate 200.

That is, for substrate testing, the test pads can be used to access these signal pins of the controller 102 for direct access to the NAND dies. In other words, the signal pins (Bypass, MS, CLK, RB #, DQ0, etc.), together with the direct access control logic 210, may be design-in with the controller 102. These signal pins may be used for substrate testing only, or may be later used for run-time testing. Because the number of the required signal pins (e.g., a total of 5) is significantly less than a full testing setup, which requires separate scan signal pins for all the NAND modules as well as standard NAND bus interface with a full data signal pins (DQ0-DQ7), testing cost and complexity may be greatly reduced.

Figure 5:
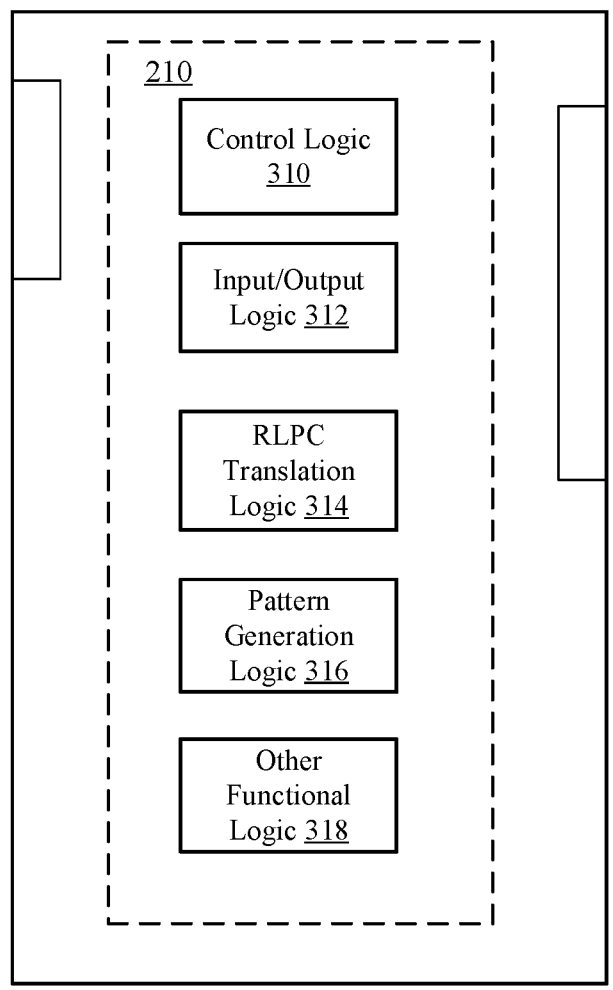
FIG. 5 illustrates a block diagram of a direct access control logic in a controller consistent with the disclosed embodiments of the present disclosure.

Based on these signal pins, the controller 102 provides a controlled path to direct access to the NAND dies by an external host. As part of the controller 102, the direct access control logic 210 provides both control and data functions to facilitate direct access to the NAND modules from the external side. The direct access control logic 210 may include circuitry implemented in hardware and/or firmware of the controller 102. FIG. 5 illustrates a block diagram of the direct access control logic 210 in the controller 102 consistent with the disclosed embodiments of the present disclosure.

As shown in FIG. 5, the direct access control logic 210 may include a control logic 310, an input/output logic 312, an RLPC (reduce low pin count) translation logic 314, a pattern generation logic 316, and other functional logic 318.

The RLPC translation logic 314 may perform translation/bridging between the external interface and the internal interface. For example, the RLPC translation logic 314 receives command/data signals from the external interface and, based on the received signals, provides corresponding signals on the internal interface to the NAND modules, and vice versa.

In certain embodiments, on the internal interface side, a reduce low pin count (RLPC) circuit configuration may be used to access the NAND modules, e.g., to write data to a NAND module or read data from the NAND module, based on an RLPC standard. The RLPC standard is a bus interface standard designed for semiconductor device testing, especially for register-level or die-level testing. The number of pins used in the testing can be significantly reduced.

That is, an RLPC test mode may be supported between the controller 102 and the NAND modules. Each NAND module may support the RLPC test mode, which may be controlled by configuring a test register (not shown) in each NAND module. The RLPC test mode may also be controlled by a test pad on the substrate. When a test pad is used, the tester or the controller 102 may cause the test pad of a NAND module to be in an active state (e.g., applying a voltage on the test pad) to force the NAND module into the RLPC test mode. In certain embodiments, the test register in a NAND module may be directly configured by the controller 102 by using WE # and DQ0 (or DQ0-DQ7) to force the NAND module into the RLPC test mode, i.e., using the RLPC bus protocol.

After the NAND module is set into the RLPC test mode, the RLPC translation logic 314 may also translate any command or data from the external bus into bus operations based on the RLPC protocol and send the command to the RLPC, and to write data to or receive data from the NAND module. Other configurations and/or test modes may also be used. For example, the RLPC translation logic 314 may be omitted when a standard NAND interface protocol is used between the controller 102 and the NAND dies.

Further, the input/output logic 312 may providing input/output functions for the direct access control logic 210. The pattern generation logic 316 may generate various test patterns based on received commands and/or data from the external interface. The test patterns can then be transmitted to the NAND modules for testing. The other functional logic 318 may provide other functions that may be used to facilitate direct access to the NAND modules.

The control logic 310 may provide various control functions of the direct access control logic 210, such as interpret operation modes, interpret received commands, and control other logics to implement operation flows for the direct access control logic 210. For example, the control logic 310 may configure a clock signal to select different data rates. The control logic 310 may also determine patterns to be generated by the pattern generation logic 316 based on received commands or data.

Figure 6:
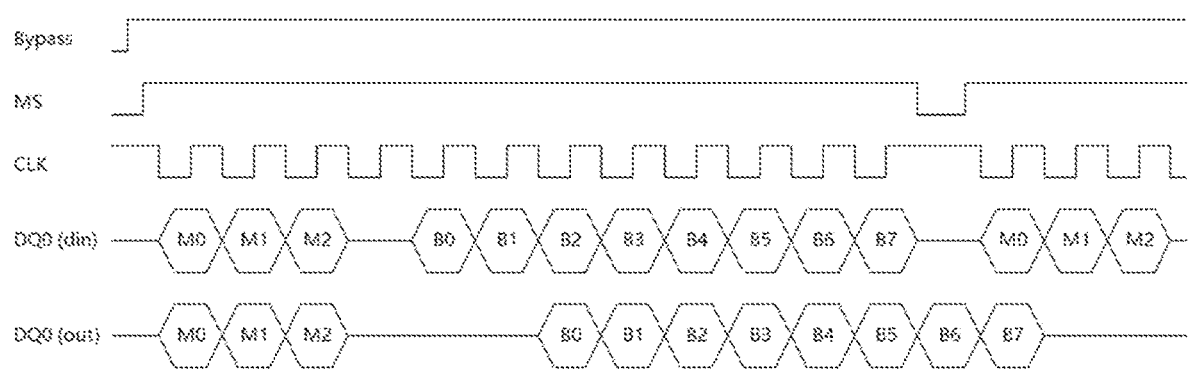
FIG. 6 illustrates a timing diagram for implementing certain bus operations consistent with the disclosed embodiments of the present disclosure.

Using the various logics (e.g., the control logic 310, input/output logic 312, RLPC translation logic 314, and pattern generation logic 316), the controller 102 (the direct access control logic 210) may implement various bus operations to enable direct access to NAND modules by the host device 104. FIG. 6 illustrates a timing diagram for implementing certain bus operations consistent with the disclosed embodiments of the present disclosure.

As shown in FIG. 6, the controller 102 may monitor the Bypass signal pin and determine whether the Bypass signal is pulled high. When the Bypass signal is pulled high, the controller 102 may enter a bypass state or bypass mode to be ready for testing (e.g., direct access to the NAND modules). For example, in the bypass mode, the controller 102 may suspend normal operation of other parts of the controller 102 and enable the direct access control logic 210 to be active for the testing. In other embodiments, the external host may first pull the Bypass signal high before the controller 102 is powered up, such that the controller 102 can be powered up to the bypass mode with the pulled-up Bypass pin.

Further, the controller 102 (the direct access control logic 210) may detect a state change of the MS signal or a toggle of the MS signal. The state change may be a rising edge (as shown in FIG. 6) or may be a falling edge. The rising edge of the MS signal may trigger the direct access control logic 210 to start receiving mode selection signals on the DQ0 signal line. The CLK pin is used to receive clock signal for bus operation, e.g., read/write data on DQ0. The RB # is used to indicate ready/busy for bus operation.

In certain embodiments, the mode selection signals may be a 3-bit code, which may support a total of 8 modes to be selected. In certain other embodiments, the mode selection signals may be a 4-bit code, which may support a total of 16 modes to be selected. As shown in FIG. 6, a 3-bit mode selection code is used, bit M0, bit M1, and bit M2, and the 3 bits are clocked-in through DQ0. The modes to be selected may include a die-selection mode, an SDR/DDR switch mode, a pattern-select mode, a command-in mode, an address-input mode, a data-in mode, and a data-out mode. Other modes may also be used. FIG. 7 is a table illustrating certain mode selection definitions consistent with the disclosed embodiments of the present disclosure.

As shown in FIG. 7, the die-selection mode corresponds to the mode code '001' (i.e., M0-M3 is '001') and the die-selection mode is used to select or deselect one, more, or all NAND dies/modules. The SDR/DDR switch mode corresponds to the mode code '010' and the SDR/DDR switch mode is used to switch host device 10 between a double data rate (DDR) and a single data rate (SDR). The pattern-select mode corresponds to the mode code '011' and the pattern-select mode is used to determine data pattern for a simplified data generator, such as a random data pattern, a fixed data pattern, an inverse data pattern, a decrease data pattern, and an increase data pattern. The command-in mode corresponds to the mode code '100' and the command-in mode is used to start a NAND command in cycle. The address-input mode corresponds to the mode code '101' and the address-input mode is used to start a NAND address input cycle. The data-in mode corresponds to the mode code '110' and the data-in mode is used to start a NAND data in cycle. The data-out mode corresponds to the mode code '111' and the data-out mode is used to start a NAND data out cycle.

Returning to FIG. 6, further, after receiving a specific mode code, the controller 102 may receive data corresponding to the specific mode code, after a pre-determined number of clock cycles. The data corresponding to a mode code and following the mode code may be referred as value of the mode code or the mode code value. As shown in FIG. 6, after M0, M1, and M2, one byte of data is received on DQ0(din), i.e., B0, B1, B2, B3, B4, B5, B6, and B7. The length and the nature of the data following the specific mode-selection word is pre-determined by the controller 102. FIG. 8 is a table illustrating certain mode selection and corresponding data consistent with the disclosed embodiments of the present disclosure.

As shown in FIG. 8, for the die-selection mode code, after receiving the die-selection mode, the controller 102 determines that the data following the die-selection mode word is to set the select one or more NAND dies for direct access. The length of the data may be 2 or 4 bytes, depending on how many NAND dies are connected to the controller 102, as each bit is mapped to one die.

For example, when the controller 102 is connected to a total of 16 NAND dies with a total of 4 channels (each channel includes 4 NAND dies), 2 bytes of data are needed to select one or more NAND dies. FIG. 9 is a table illustrating certain die selection data descriptions consistent with the disclosed embodiments of the present disclosure.

As shown in FIG. 9, two bytes are used for the die selection data, Byte0 and Byte 1. Byte0 corresponds to channels CH0 and CH1, and Byte1 corresponds to channels CH2 and CH3. In Byte0, 4 bits (CE0, CE1, CE2, and CE3) represents CE # for 4 NAND dies connected to channel CH0 respectively, and 4 bits (CE0, CE1, CE2, and CE3) represents CE # for 4 NAND dies connected to channel CH1 respectively. In Byte1, 4 bits (CE0, CE1, CE2, and CE3) represents CE # for 4 NAND dies connected to channel CH2 respectively, and 4 bits (CE0, CE1, CE2, and CE3) represents CE # for 4 NAND dies connected to channel CH3 respectively.

Further, as shown in FIG. 9, when all bits are selected (all bits in Byte0 and Byte 1 is '1'), all 16 NAND dies are selected. When all bits are deselected (all bits in Byte0 and Byte 1 is '0'), all 16 NAND dies are deselected. When Byte0 and Byte1 are '1000100010001000', 4 NAND dies are selected (CE0/CH0, CE0/CH1, CE0/CH2, CE0/CH3). When Byte0 and Byte1 are '1111000000000000', 4 NAND dies in 1 channel CH0 are selected (CE0/CH0, CE1/CH0, CE2/CH0, CE3/CH0). When Byte® and Byte1 are '1000000000000000', only 1 NAND die in 1 channel CH0 is selected (CE0/CH0). Similarly, any one NAND die or any combination of NAND dies may be selected. After receiving the Byte® and Byte1, the controller 102 may set the CE # on the NAND interface to enable the selected NAND die(s).

Returning to FIG. 8, for the SDR/DDR switch mode, after receiving the SDR/DDR switch mode code, the controller 102 determines that the data following the SDR/DDR switch mode code is to set the data rate to SDR or DDR. The length of the data may be 1 byte, 0x0 indicates the SDR data rate, and the 0x1 indicates the DDR data rate.

Further, for the pattern select mode, after receiving the pattern select mode code (i.e., the mode code that is set to the pattern select mode or 0x011 in FIG. 8), the controller 102 determines that the data following the pattern select mode code is to select the test pattern generation type. The length of the data may be 1 byte, 0x0 indicates the random data pattern, 0x1 indicates the fixed data pattern, 0x2 indicates the inverse data pattern, 0x4 indicates the decrease data pattern, and 0x8 indicates the increase data pattern. Other data values may also be used. FIG. 10 is a table illustrating certain pattern selection mode code and data descriptions consistent with the disclosed embodiments of the present disclosure.

As shown in FIG. 10, the 1 byte data following the pattern select mode code includes 8 bits, b0, b1, b2, b3, b4, b5, b6, and b7. When b0-b7 is '00000000', the pattern type is the random pattern and, for example, the test pattern may be set as whatever inputted data from DQ0 under the data-in mode. When b0-b7 is '10000000', the pattern type is the fixed data pattern and, for example, the test pattern may be set based on the start byte from DQ0 under the data-in mode. For example, if the start byte is 0x55, then the test pattern is set to all 0x55. When b0-b7 is '01000000', the pattern type is the inverse data pattern and, for example, the test pattern may be set based on the start byte from DQ0 under the data-in mode. For example, if the start byte is 0xAA, then 0x55, 0xAA, 0x55, . . . .

When b0-b7 is '001000000', the pattern type is the decrease data pattern and, for example, the test pattern may be set based the start byte from DQ0 under the data-in mode and each subsequent byte is decreased by 1. For example, if the start byte is 0xFF, then 0xFE, 0x00, and then starting from 0xFF again, . . . , 0x00. The test pattern can be repeated until all required data is provided. Further, when b0-b7 is '00010000', the pattern type is the increase data pattern and, for example, the test pattern may be set based on the start byte from DQ0 under the data-in mode and each subsequent byte is increased by 1. For example, if the start byte is 0x00, then 0x01, 0xFF, 0x00, 0xFF.

Returning to FIG. 8, for the command-in mode, after receiving the command-in mode code, the controller 102 determines that the data following the command-in mode code is NAND command in cycle, which is placed on the internal interface to the selected NAND die(s). Further, for the address-input mode, after receiving the address-input mode code, the controller 102 determines that the data following the address-input mode code is NAND address input cycle, which is placed on the internal interface to the selected NAND die(s). For the data-in mode, after receiving the data-in mode code, the controller 102 determines that the data following the data-in mode code is NAND data in cycle, which is placed on the internal interface to the selected NAND die(s). For the data-out mode, after receiving the data-out mode code, the controller 102 determines that the data read from the selected NAND die is placed on the DQ0 (or DQ0-DQ7) for output the data-out mode code.

Figure 11:
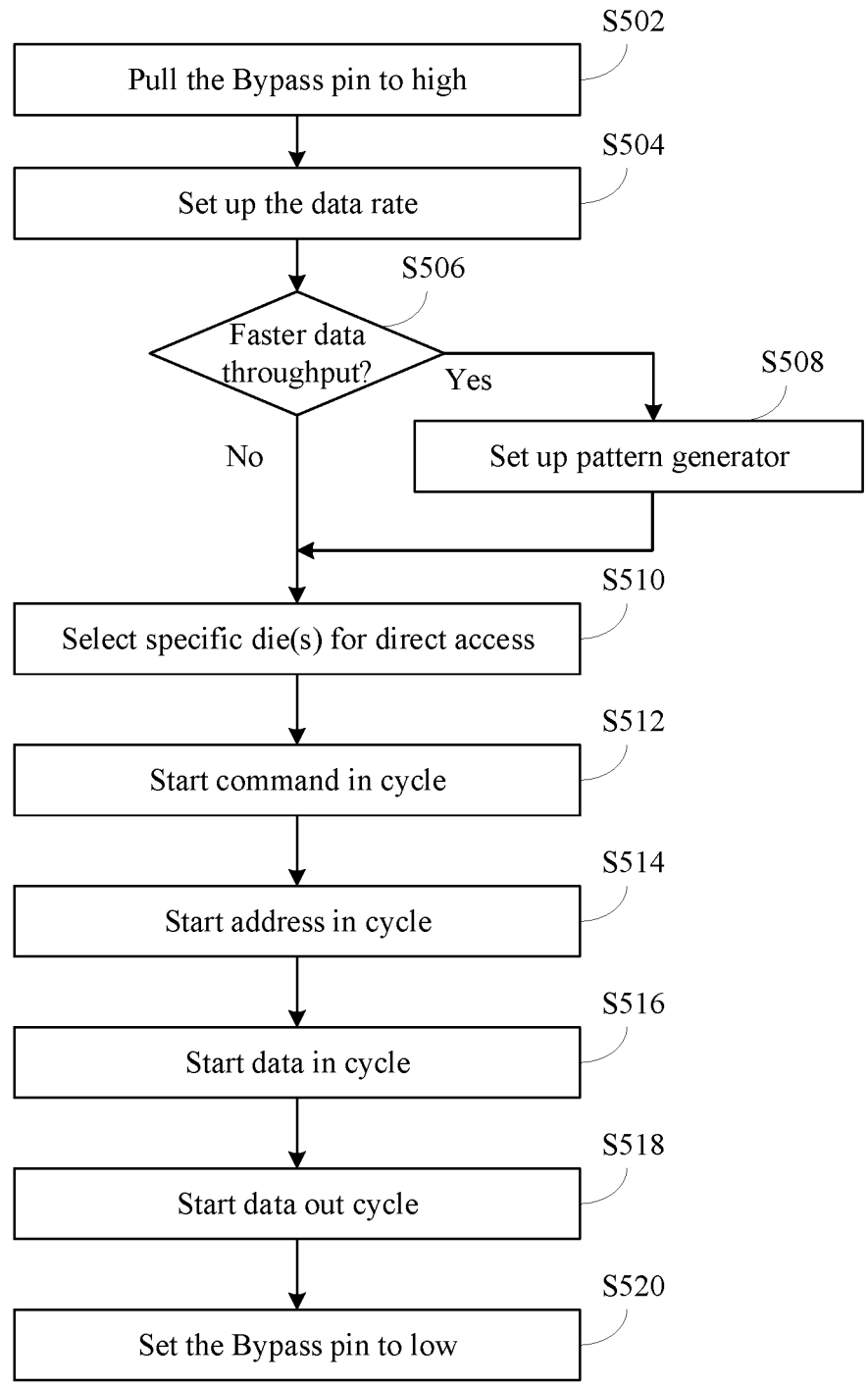
FIG. 11 illustrates a flow chart of a testing process 500 consistent with the disclosed embodiments of the present disclosure.

By using the above various modes, the controller 102 may implement certain flash chip tests from the host device 104 with direct access of the NAND dies/modules. FIG. 11 illustrates a flow chart of a testing process 500 consistent with the disclosed embodiments of the present disclosure.

As shown in FIG. 11, at the beginning of the testing process, an external host device or tester device may pull the Bypass pin to high to start the bypass mode for the controller 102 (S502). The controller 102 may detect the Bypass pin being pulled high and may be placed in the bypass mode and enable the direct access control logic 210 into operational (e.g., switch on the power Vcc to the direct access control logic 210). The controller 102 may also write to the test register of each of the NAND modules connected to the controller 102 to enable RLPC communication between the controller 102 and the NAND modules. Alternatively, the controller 102 may write to the test register of any selected NAND modules by the die-selection mode code.

Further, the host device may set up the data rate using the mode code '010', the SDR/DDR switch mode, to switch host device IO between SDR and DDR (S504).

The host device may also determine whether to use faster data throughput for the testing (S506). When the host device determines to use faster data throughput based on a specific testing requirement (S506; Yes), the host device may set up pattern generator using the mode code '011', the pattern-select mode, to select a specific pattern type (S508).

Further, the host device may determine which NAND die or dies to test and use the mode code '001', the die selection mode, to select a specific die or dies for direct access/testing (S510).

After selecting the NAND die(s), the host device may use the mode code '100', the command-in mode, to start a NAND command in cycle (S512). For example, the host device may issue a write command to write data and/or generated pattern data to the selected NAND die(s).

After issuing the command, the host device may use the mode code '101', the address-input mode, to start a NAND address input cycle to set the address of the NAND die corresponding to the command (S514).

After the address is issued, the host device may use the mode code '110', the data-in mode, to start a NAND data in cycle to input data for testing (S516). For example, if the command is a write command, the data inputted is the data to be written to the address of the NAND die selected. If the pattern generation is selected, the controller 102 may generate the data pattern based on the selected pattern type and input the data pattern on the NAND interface to the address of the NAND die selected.

After all data is inputted, the host device may wait for data back from the NAND die(s) or may read back data from the NAND die(s) previously written to (S518). The host device may use the mode code '111', the data-out mode, to start a NAND data out cycle to read data. The controller 102 may read data from the NAND interface and output data to the host device on DQ0 (or DQ0-DQ7).

Although the writing process is used as an example, the host device can also perform other types of testing, such as reading, configuring, etc., using the various mode codes. After the direct access is completed, the host device may pull down the Bypass pin to take the controller 102 out of the bypass mode (S520). On the controller side, after becoming operational under the bypass mode, the controller 102 (the direct access control logic 210) may enter a loop for detecting a toggle of the MS pin to determine whether a mode code is received, and to initiate a corresponding action until the Bypass is pulled down by the host device.

Thus, according to the disclosed embodiments, an improved NAND direct access method and system is provided. By using the disclosed methods and systems, the NAND direct access can be provided based on controller design-in RLPC interface, which uses less pin count and minimum circuit to access NAND flash via controller. Further, new design pin in controller (Bypass, MS, CLK, RB #, DQ0, etc.) may be led out to test pads connected to the substrate, and the input-output modes of RLPC includes die selection, SDR/DDR switch, pattern select, command in, address in, data in, data out and so on, to support easy and complete testing. For applications with multi-channel and limited substrate layout space, X1 IO is provided using only DQ0 pin, and for burn-in test applications, X8 IO can also be provided using additional DQ1-DQ7 pins to speed up data through put rate during test.

Although the principles and implementations of the present disclosure are described by using specific embodiments in the specification, the foregoing descriptions of the embodiments are only intended to help understand the present disclosure. In addition, features of aforementioned different embodiments may be combined to form additional embodiments. A person of ordinary skill in the art may make modifications to the specific implementations and application range according to the idea of the present disclosure. Hence, the content of the specification should not be construed as a limitation to the present disclosure.

What is claimed is:

1. A memory device, comprising:
a substrate;
a controller disposed on the substrate and providing an external interface; and
a plurality of flash memory dies connected to the controller through an internal interface,
wherein:
the external interface includes at least a bypass pin, a mode selection pin, and a data pin and is used by an external host to direct access the plurality of flash memory dies through the controller;
the bypass pin is used to enable the controller to enter in a direct access state in which the mode selection pin and the data pin are operational; and
the mode selection pin is used to trigger the controller to receive a mode code on the data pin, the mode code indicating one of a plurality of predetermined input-output modes of the controller in the direct access state, and to receive a mode code value on the data pin, the mode code value determining information under the predetermined input-output mode indicated by the mode code.

2. The memory device according to claim 1, wherein the external interface further includes a clock pin and a ready pin for bus operations while the controller is in the direct access state.

3. The memory device according to claim 2, wherein:
the substrate includes a plurality of test pads respectively connected to the bypass pin, the mode selection pin, the data pin, the clock pin, and the ready pin; and
the external host uses the plurality of test pads to connect to the bypass pin, the mode selection pin, the data pin, the clock pin, and the ready pin.

4. The memory device according to claim 1, wherein:
the external interface further includes seven additional data pins, and the seven additional data pins in combination with the data pin are used for a byte-wider data transmission on the external interface via a corresponding byte-wider parallel data bus.

5. The memory device according to claim 1, wherein:
the predetermined input-output modes include a die-selection mode; and
the mode code of the die-selection mode indicates that one or more of the plurality of flash memory dies are selected for direct access, and the mode code value following the mode code of the die-selection mode determine the one or more of the plurality of flash memory dies.

6. The memory device according to claim 5, wherein:
the predetermined input-output modes further include a data-rate switch mode; and
the mode code of the data-rate switch mode indicates whether a data rate switch is to be performed, and the mode code value following the mode code of the data-rate switch mode determines a single data rate (SDR) or a double data rate (DDR) to be switched to.

7. The memory device according to claim 5, wherein:
the predetermined input-output modes further include a pattern-selection mode; and
the mode code of the pattern-selection mode indicates whether a data pattern is to be generated by the controller to improve throughput, and the mode code value following the mode code of the pattern-selection mode determine the data pattern to be generated by the controller.

8. The memory device according to claim 5, wherein:
the predetermined input-output modes further include a command-in mode, an address-in mode, a data-in mode, and a data-out mode;

the mode code of the command-in mode indicates a command-in cycle following the mode code of the command-in mode on the data pin;

the mode code of the address-in mode indicates an address-in cycle following the mode code of the address-in mode on the data pin;

the mode code of the data-in mode indicates a data-in cycle following the mode code of the data-in mode on the data pin; and the mode code of the data-out mode indicates a data-out cycle following the mode code of the data-out mode on the data pin.

9. The memory device according to claim 1, wherein the mode code is a 3-bit code or a 4-bit code.

10. The memory device according to claim 1, wherein the plurality of flash memory dies are NAND memory dies, the plurality of flash memory dies and the controller are packaged in one eMMC or UFS package.

11. The memory device according to claim 1, wherein:
each of the flash memory dies includes a test register to be set by the controller to cause the flash memory die to use a reduce low pin count (RLPC) standard to communicate over the internal interface, such that data on the data pin is relayed to and/or from the flash memory die based on the RLPC standard.

12. The memory device according to claim 11, wherein the controller includes:
an input/output logic to receive the data on the data pin;
an RLPC translation logic to convert the data on the data pin to signals on the internal interface based on the RLPC standard; and
a control logic to set the predetermined input-output mode based on the mode code.

13. A method for testing a memory device having a substrate, a controller disposed on the substrate and providing an external interface, and a plurality of flash memory dies connected to the controller through an internal interface, the method comprising:
operating a bypass pin in the external interface to enable the controller to enter in a direct access state in which a mode selection pin and a data pin in the external interface are operational;
providing a plurality of predetermined input-output modes of the controller in the direct access state;
triggering, by the mode selection pin in the external interface, the controller to receive a mode code, which indicates one of the plurality of predetermined input-output modes, on the data pin in the external interface, and to receive a mode code value, which determines information under the predetermined input-output mode indicated by the mode code, on the data pin; and
directly accessing, by use of the data pin, the plurality of flash memory dies through the controller.

14. The method according to claim 13, wherein:
the external interface further includes a clock pin and a ready pin, and the method further includes performing bus operations, by use of the clock pin and the ready pin, while the controller is in the direct access state;
the substrate includes a plurality of test pads respectively connected to the bypass pin, the mode selection pin, the data pin, the clock pin, and the ready pin, and the method further includes using the plurality of test pads to connect to the bypass pin, the mode selection pin, the data pin, the clock pin, and the ready pin.

15. The method according to claim 13, wherein the predetermined input-output modes include a die-selection mode, and the method further includes:

placing the mode code of the die-selection mode on the data pin after triggering the controller to receive a mode code, to indicate that one or more of the plurality of flash memory dies are selected for direct access, and sending the mode code value following the mode code of the die-selection mode to select the one or more of the plurality of flash memory dies.

16. The method according to claim 13, wherein the predetermined input-output modes further include a data-rate switch mode, and the method further includes:
placing the mode code of the data-rate switch mode on the data pin after triggering the controller to receive a mode code, to indicate whether a data rate switch is to be performed, and sending the mode code value following the mode code of the data-rate switch mode to determine a single data rate (SDR) or a double data rate (DDR) to be switched to.

17. The method according to claim 13, wherein the predetermined input-output modes further include a pattern-selection mode, and the method further includes:
placing the mode code of the pattern-selection mode on the data pin after triggering the controller to receive a mode code, to indicate whether a data pattern is to be generated by the controller to improve throughput, and sending the mode code value following the mode code of the pattern-selection mode to determine the data pattern to be generated by the controller.

18. The method according to claim 15, wherein the predetermined input-output modes further include a command-in mode, an address-in mode, a data-in mode, and a data-out mode; and the method further includes:
placing the mode code of the command-in mode indicating a command-in cycle following the mode code of the command-in mode on the data pin;
placing the mode code of the address-in mode indicating an address-in cycle following the mode code of the address-in mode on the data pin;
placing the mode code of the data-in mode indicating a data-in cycle following the mode code of the data-in mode on the data pin; and
placing the mode code of the data-out mode indicating a data-out cycle following the mode code of the data-out mode on the data pin.

19. A controller for controlling a plurality of flash memory dies, comprising:
an external interface; and
an internal interface, through which the plurality of flash memory dies are connected to the controller;
wherein:
the external interface includes at least a bypass pin, a mode selection pin, and a data pin and is used by an external host to direct access the plurality of flash memory dies through the controller;
the bypass pin is used to enable the controller to enter in a direct access state in which the mode selection pin and the data pin are operational; and
the mode selection pin is used to trigger the controller to receive a mode code on the data pin, the mode code indicating one of a plurality of predetermined input-output modes of the controller in the direct access state, and to receive a mode code value on the data pin, the mode code value determining information under the predetermined input-output mode indicated by the mode code.

20. The controller according to claim 19, wherein:
the external interface further includes seven additional data pins, and the seven additional data pins in combination with the data pin are used for a byte-wider data transmission on the external interface via a corresponding byte-wider parallel data bus;

the controller further includes:

an input/output logic to receive the data on the data pin;

a reduce low pin count (RLPC) translation logic to convert the data on the data pin to signals on the internal interface based on the RLPC standard; and a control logic to set the predetermined input-output mode based on the mode code.

\* \* \* \* \*